United States Patent [19]
Martin

[11] Patent Number: 6,040,726
[45] Date of Patent: Mar. 21, 2000

[54] DIGITAL DUTY CYCLE CORRECTION LOOP APPARATUS AND METHOD

[75] Inventor: David G. Martin, Bethlehem, Pa.

[73] Assignee: Lucent Technologies Inc., Murray Hill, N.J.

[21] Appl. No.: 09/152,656

[22] Filed: Sep. 14, 1998

[51] Int. Cl.[7] .................................................. H03K 3/017
[52] U.S. Cl. .......................... 327/175; 327/172; 327/261
[58] Field of Search .................................... 327/175, 170, 327/172, 141, 160, 161, 164, 267, 297

[56] References Cited

U.S. PATENT DOCUMENTS

| | | | |
|---|---|---|---|
| 4,799,022 | 1/1989 | Skierszkan | 327/116 |
| 5,245,637 | 9/1993 | Gersbach et al. | 375/119 |
| 5,260,608 | 11/1993 | Marbot | 327/261 |
| 5,481,228 | 1/1996 | Badyal | 331/74 |

*Primary Examiner*—Kenneth B. Wells
*Assistant Examiner*—Hai L. Nguyen

[57] ABSTRACT

An apparatus for providing a clock signal having a fifty-percent duty cycle that comprises a signal input having a plurality of pulses. A delay means is provided for producing a delayed output signal having a plurality of delayed pulses, each of the plurality of delayed pulses being delayed relative to one of the plurality of pulses. A means for measuring a first delay between one of said plurality of delayed pulses and a next of the plurality of pulses is provided. A means for measuring a second delay between one of the plurality of pulses and a corresponding delayed pulse of the plurality of delayed pulses is provided. A means for comparing the first delay to the second delay is provided. A means for increasing the delay of the delay means if the first delay is greater than the second delay and decreasing the delay of the delay means if said first delay is less than the second delay is provided. A means for combining the signal input and the delayed output signal thereby outputting the clock signal having a fifty-percent duty cycle is provided.

15 Claims, 4 Drawing Sheets

DIGITAL DUTY CYCLE CORRECTION LOOP APPARATUS AND METHOD

FIELD OF THE INVENTION

This invention relates to the field of digital circuitry and, in particular, to a digital circuit and method for providing a clock signal having a fifty-percent duty cycle.

BACKGROUND OF THE INVENTION

In digital circuits, a clock signal serves as a time-synchronizing standard and sets the speed of operation of the components of the circuit. The clock signal generally consists of a regular stream of pulses having a particular shape, for example a square-shape, and a duty cycle, which is a measure of the proportion of time the clock signal is at a logic-level high compared to the period of the clock signal (the time it takes for the clock signal to complete one cycle).

For many digital circuits, it is desirable to use a clock signal having a fifty-percent duty cycle. For example, in a digital-to-analog converter circuit and a switched capacitor filter circuit, the use of a fifty-percent duty cycle clock signal will facilitate a circuit design having optimized analog characteristics. In prior art circuits, a clock signal having a fifty-percent duty cycle is generally provided using either a phase locked loop (PLL) circuit or AC coupled elements.

However, a drawback of these prior art techniques for providing a clock signal having a fifty-percent duty cycle is that they employ analog circuit elements, such as a voltage controlled oscillator or capacitors, to produce the desired clock signal. The disadvantage of using analog circuitry for this purpose is that such an implementation is generally complex to implement and sensitive to noise and temperature variations. Also, because clock signals are generally used to drive digital circuits, using the prior art analog clock generators requires the mixing of analog and digital circuitry which adds complexity to the circuit design and precludes implementing the entire circuit in an application specific integrated circuit (ASIC). Accordingly, it is desirable to provide a clock signal having a duty cycle of approximately fifty-percent using only digital circuitry.

SUMMARY OF THE INVENTION

The present invention is directed to overcoming the shortcomings of the prior art. The present invention is directed to a digital circuit and method for providing a clock signal having a duty cycle of approximately fifty-percent. The apparatus of the present invention includes a signal input consisting of a plurality of pulses and a programmable delay line that receives the signal input and produces a delayed output signal consisting of a plurality of delayed pulses each of which are delayed relative to a corresponding pulse of the signal input. The programmable delay line includes a plurality of delay selection lines for adjusting the time delay between the plurality of pulses of the signal input and the corresponding delayed pulse of the delayed output signal. A first thermometer code generator receives the delayed output signal and signal input and calculates a first thermometer code which represents the time delay between one of the plurality of delayed pulses and a next pulse of the signal input. The second thermometer code generator receives the signal input and delayed output signal and generates a second thermometer code output which represents the time delay between one of the plurality of pulses of the signal input and a next pulse of the delayed output signal. A comparator circuit compares the first thermometer code output to the second thermometer output and outputs the results to a counter circuit. Based on the results of the comparison, the counter circuit outputs a signal coupled to the delay selection lines input for adjusting the time delay between the pulses of the signal input and the delayed pulses of the delayed output signal. If the first thermometer code output is greater than the second thermometer code output, then the time delay between the pulses of the signal input and the delayed pulses of the delayed output signal is increased. If the first thermometer code is less than the second thermometer code output, then the time delay between the pulses of the signal input and the delayed pulses of the delayed output signal is decreased. If the first thermometer code output equals the second thermometer code output, then the time delay between the pulses of the signal input and the delayed pulses of the delayed output signal is left unchanged. An or-gate receives the signal input and the delayed output signal and generates an output signal which is received by a toggle flip-flop. When the first thermometer code output equals the second thermometer code output a clock output signal having a fifty-percent duty cycle is output on a Q output of the toggle flip-flop. Thus, by using the apparatus of the present invention, a clock signal having a fifty-percent duty cycle is generated using digital circuitry.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWING FIGURES

In the drawing figures, which are not to scale, and which are merely illustrative, and wherein like reference numerals depict like elements throughout the several views.

DETAILED DESCRIPTION OF THE PREFERRED EMBODIMENTS

Figure 1:
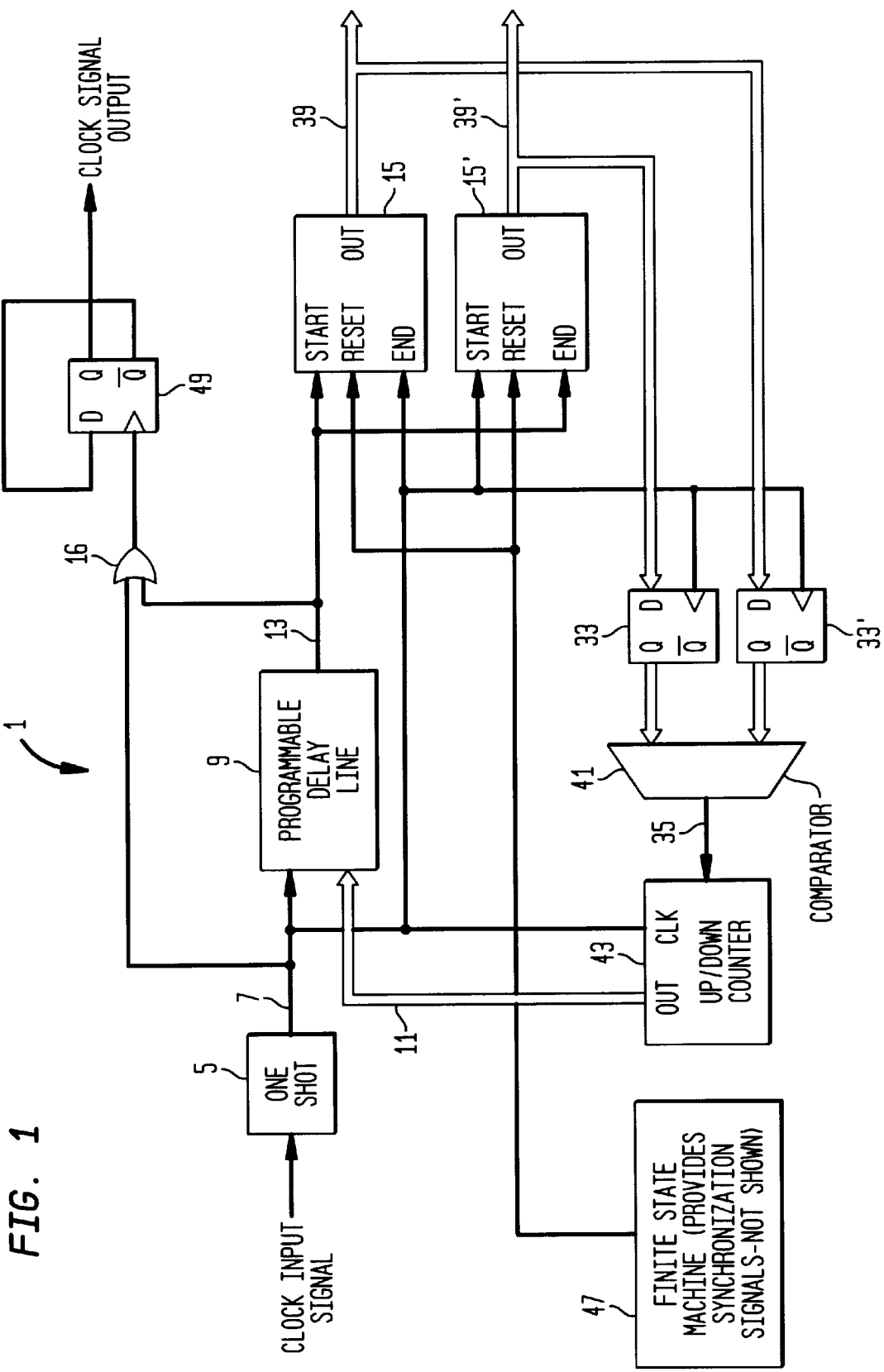
FIG. 1 is a block diagram of the duty cycle correction loop apparatus constructed in accordance with the present invention.

Referring now to FIG. 1, there is shown a block diagram of the duty cycle correction loop apparatus 1 of the present invention. Apparatus 1 receives a clock input signal which is a periodic signal having a plurality of regularly spaced pulses such that the signal has a constant frequency but arbitrary duty cycle. The clock input signal may be generated by any device known in the art including, but not limited to, a crystal or pulse generator. A one-shot circuit 5 receives the clock input signal and, for each rising edge of the clock input signal, outputs a short duration pulse. Alternatively, one-shot circuit 5 outputs a short duration pulse for each falling edge of the clock input signal. The plurality of short duration pulses output from one-shot circuit 5 form a signal input 7. A programmable delay line 9 receives signal input 7 a produces a delayed output signal 13. Each pulse of delayed output signal 13 is delayed relative to a corresponding pulse of signal input 7. The length of the time delay applied to the pulses of signal input 7 by programmable delay line 9 is digitally selectable via a plurality of delay selection lines 11 coupled to programmable delay line 9.

Figure 4:
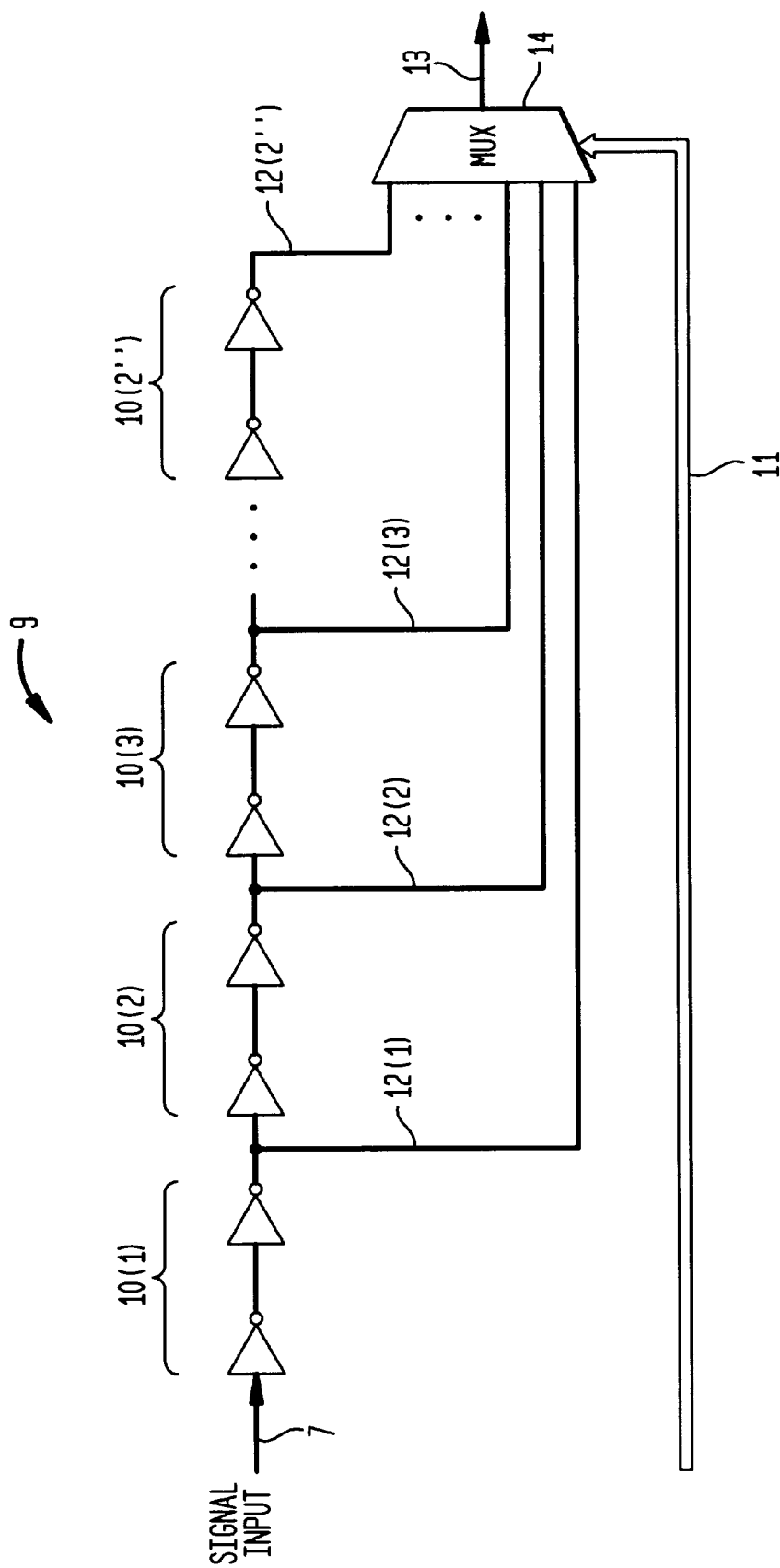
FIG. 4 is a block diagram of the programmable delay line of FIG. 1.

As shown in FIG. 4, programmable delay line 9 consists of $2^n$ inverters stages 10 with each inverter stage 10 having a propagation delay of approximately 1 ns. Between each inverter stage 10 is a tap line 12 with all tap lines 12 being input to a multiplexor 14. To select a particular time delay for programmable delay line 9, a binary number is placed on delay selection lines 11 that corresponds to the inverter stage 10 which provides the desired delay. In an exemplary embodiment, programmable delay line 9 consists of eight inverters. Therefore, to select a 5 ns delay, tap line 12(5) (not shown) is selected by placing a '101' on delay selection lines 11. As a practical matter, however, programmable delay line 9 would require more stages, for example, 128, to achieve the required range of time delays. For example, if the clock input signal has a frequency of 13 MHZ (a 76 ns period) and a 1 ns resolution is desired for the duty cycle, at least 76 delay elements would be required to cover this range.

Signal input 7 and delayed output signal 13 are input to an or-gate 16 and the output of or-gate 16 is input to a toggle flip-flop 49. Flip-flop 49 has a Q output, which as a result of the operation of apparatus 1 further described below, contains a clock signal output having a fifty-percent duty cycle.

Figure 2:
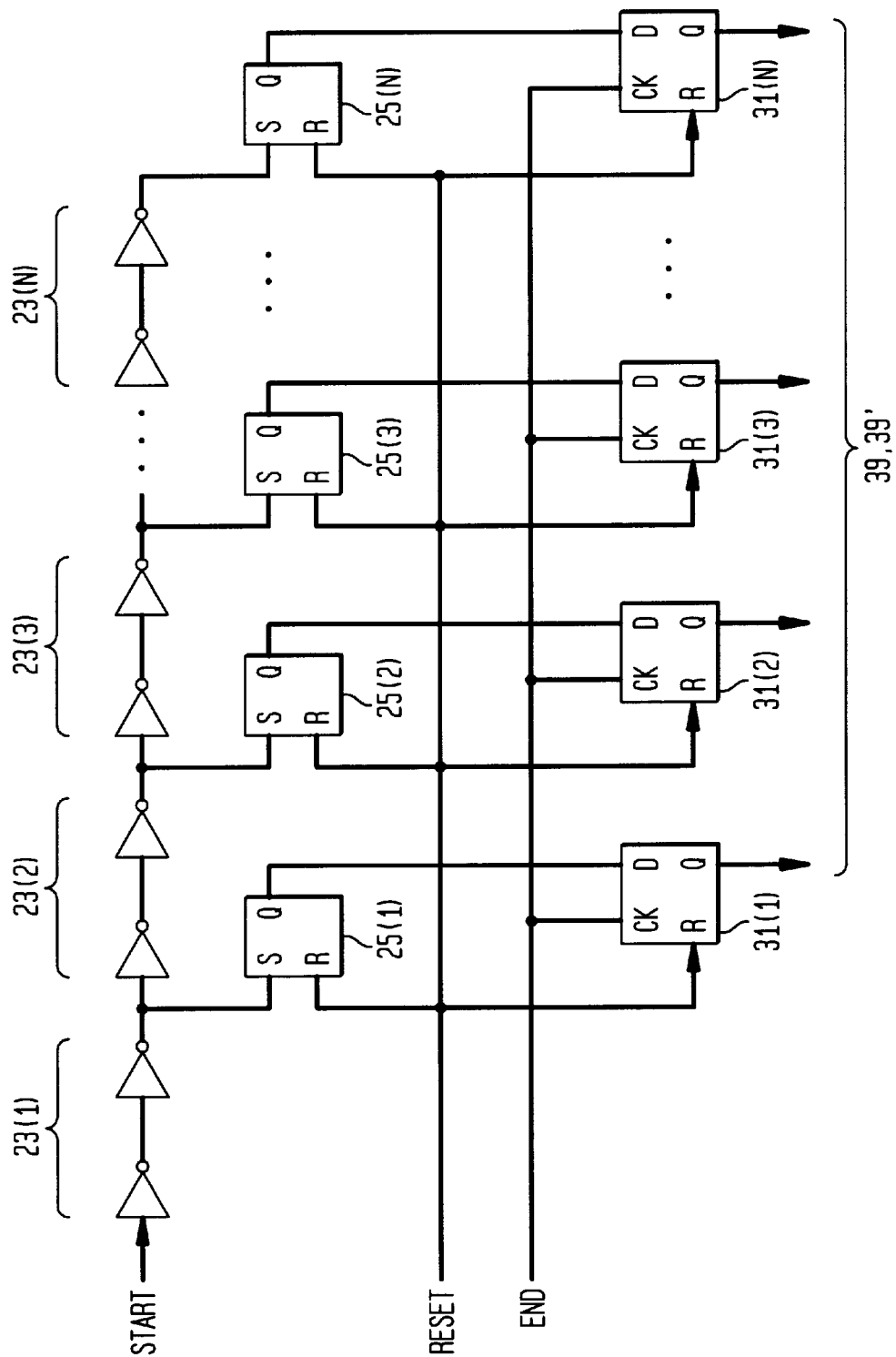
FIG. 2 is a block diagram of the thermometer code generator of FIG. 1.

Signal input 7 and delayed output signal 13 are both input to each of a first thermometer code generator 15 and a second thermometer code generator 15'. (See R. Plassche, "Integrated Analog-to-Digital and Digital-to-Analog Converters", Kluwer Academic Publishers, 1994, pp 112–113, for a description of thermometer codes). Referring now to FIG. 2 there is shown a block diagram of thermometer code generators 15, 15' which are identical except for the manner in which signal input 7 and delayed output signal 13 inputs are configured.

Referring initially to the configuration of first thermometer code generator 15, delayed output signal 13 is coupled to a START input and signal input 7 is connected to an END input. Delayed output signal 13 is processed through a series of N inverters 23(1)–23(N). A series of set-reset latches 25(1)–25(N) is provided with each set-reset latch 25(1)–25(N) having an S input, an R input and a Q output. The output of inverters 23(1)–23(N) are coupled to the S input of latches 25(1)–25(N), respectively. A series of latches 31(1)–31(N) is provided with each latch 31(1)–31(N) having a D input coupled to the Q output of latches 25(1)–25(N), respectively, input, a CK each of which are coupled to signal input 7, and a Q output. In an exemplary embodiment, latches 25 (1)–25(N) may be D-type flip flops or an equivalent. The aggregate of all Q outputs of latches 31(1)–31(N) constitutes a first thermometer code output 39 generated first thermometer code generator 15. In an exemplary embodiment, first thermometer code generator 15 includes eight inverters 23, set-reset latches 25 and latches 31 (i.e. N equals 8) and each of inverters 23(1)–23(8) have a propagation delay of approximately 1 ns. However, as a practical matter, first thermometer code generator 15' would require more stages, for example 128, to cover the desired range.

Second thermometer code generator 15' is similarly configured except that signal input 7 is coupled to START input, delayed output signal 13 is connected to END input. Second thermometer code generator 15' generates a second thermometer code output 39'.

Thermometer code outputs 39, 39' are latched to latches 33, 33'. Thermometer code outputs, 39, 39, which may be D-type flip-flops or an equivalent structure, are then input to a comparator 41. Comparator 41 compares thermometer code outputs 39, 39' and generates an output 35 indicative of whether first thermometer code output 39 is greater than, less than or equal to second thermometer code output 39'.

An up/down counter 43 is provided which receives output 35 of comparator 41. Counter 43 has an OUT output that is coupled to tap selection lines 11.

Apparatus 1 also includes a state machine 47 that is used to control and sequence the operations of apparatus 1. For example, state machine 47 includes a RESET line that resets thermometer code generators 15, 15' prior to the calculation of each thermometer code output 39, 39' and also causes thermometer code outputs 39, 39' to be latched by latches 33, 33' prior to the comparison performed by comparator 41.

Figure 3:
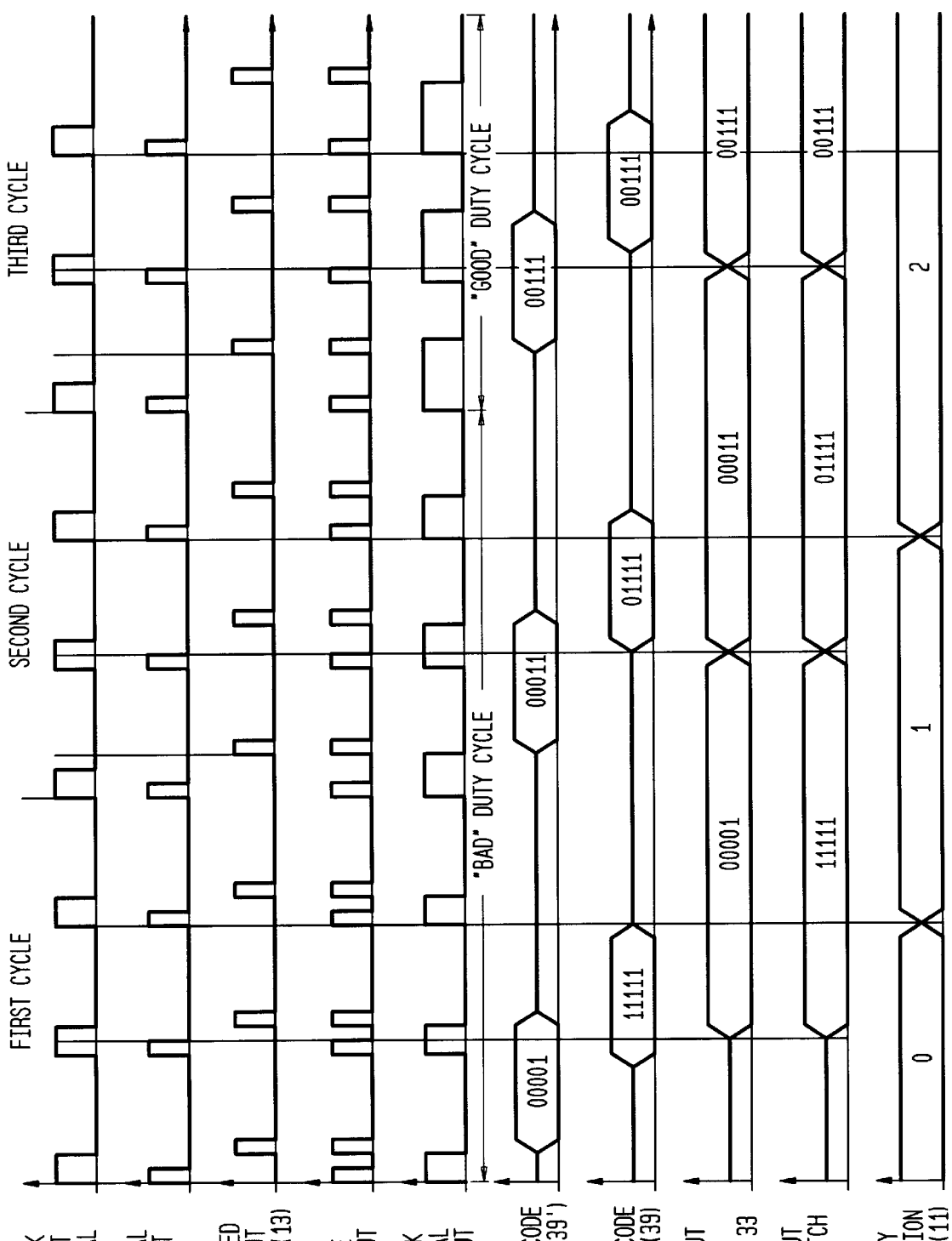
FIG. 3 is a timing diagram showing the operation of the apparatus of FIG. 1.

Referring now to FIG. 3, the operation of apparatus 1 will now be described. In the first cycle of operation of apparatus 1, the clock input signal is input into one-shot 5 of apparatus 1 thereby generating signal input 7. Programmable delay line 9 receives signal input 7 and generates delayed output signal 13. The time delay between the first pulse of signal input 7 and the first pulse of delayed output signal 13 is determined by the initial setting of delay selection lines 11 (which, for purposes of illustration, is assumed to be set to generate a minimum time delay through programmable delay line 9).

Next, second thermometer code generator 15' calculates second thermometer code output 39' which represents the time delay between the first pulse of signal input 7 and the corresponding delayed pulse of delayed output signal 13. In the example illustrated in FIG. 3, second thermometer code output 39' is 00001.

Similarly, first thermometer code generator 15 measures the time delay between the first delayed pulse of delayed output signal 13 and the next pulse of signal input 7. Thermometer code output 39 thus contains a binary number having a number of 1's that represents the time delay between the delayed pulse of delayed output signal 13 and the next pulse of signal input 7. In the example of FIG. 3 first thermometer code output is 11111.

Next, thermometer code outputs 39, 39' are latched, input into comparator 41 and compared. Because first thermometer code output 39 is greater than second thermometer code output 39', counter 43 increments delay selection lines 11 from 0 to 1 thereby increasing the delay between the next pulse of signal input 7 and the next corresponding delayed pulse of delayed output signal 13, as is shown in the second cycle of operation of apparatus 1.

In the second cycle of operation, the same process is repeated and, in the example of FIG. 3, 00011 and 01111 is generated for thermometer code outputs 39', 39, respectively. Because first thermometer code output is still greater, counter 43 once again increments delay selection lines 11 for 1 to 2 thereby increasing the time delay between the next pulse of signal input 7 and the next corresponding delayed pulse of delayed output signal 13.

In the third cycle of operation, the process is repeated again. However, this time, because thermometer code outputs 39, 39' are equal, counter 43 does not modify delay selection lines 11 thereby leaving the delay through programmable delay line 9 unchanged. Because thermometer code outputs 39, 39' are equal, the delay between the pulse of signal input 7 and the corresponding delayed pulse of delayed output signal 13 is equal to the time delay between the corresponding delayed pulse and the next pulse of signal input 7. Under this condition, the output of or-gate 16 will toggle flip-flop 49 at evenly spaced intervals thereby producing a clock signal output having a fifty-percent duty cycle. Thus, by using apparatus 1 of the present invention, a clock output signal having a fifty-percent duty cycle is generated using digital circuitry.

It is apparent from the above description that the signal produced by apparatus 1 will not always have precisely a fifty-percent duty cycle. For instance, as illustrated in FIG. 3, it takes several cycles of operation of apparatus 1 for an appropriate delay through programmable delay line 9 to be selected which results in first thermometer code output 39 being equal to second thermometer code output 39'. Also, because the duty cycle of clock input signal may vary over time, the delay through programmable delay line 9 may have to be adjusted so that a fifty-percent duty cycle will be maintained on the Q output of flip-flop 49.

Thus, while there have been shown and described and pointed out fundamental novel features is applied to preferred embodiments thereof, it will be understood that various omissions and the substitutions and changes in the form and details of the disclosed invention may be made by those skilled in the art without departing from the spirit of the invention. It is the intention, therefore, to be limited only as indicated by the scope of the claims appended hereto.

I claim:

1. An apparatus for providing a clock signal having a fifty-percent duty cycle, comprising:

a signal input having a plurality of pulses;

a programmable delay line coupled to said signal input and producing a delayed output signal having a plurality of delayed pulses, each of said plurality of delayed pulses being delayed relative to one of said plurality of pulses, said programmable delay line having a plurality of delay selection lines for adjusting the delay between said each of said plurality of pulses and a corresponding delayed pulse of said plurality of delayed pulses;

a first thermometer code generator, said delayed output signal and said signal input being coupled to said first thermometer code generator, said first thermometer code generator generating a first thermometer code output representing the delay between one of said plurality of delayed pulses and a next of said plurality of pulses;

a second thermometer code generator, said signal input and said delayed output signal being coupled to said second thermometer code generator, said second thermometer code generator generating a second thermometer code output representing the delay between one of said plurality of pulses and the corresponding delayed pulse of said plurality of delayed pulses;

a comparator circuit, said first thermometer code output and said second thermometer code output being coupled to said comparator circuit, said comparator circuit comparing said first thermometer code output to said second thermometer code output and generating an output based on the comparison;

a counter circuit receiving said output of said comparator circuit, said counter having an output coupled to said delay selection lines, so that if said first thermometer code output is greater than said second thermometer code output, then said counter output increments said delay selection lines thereby increasing the delay between said plurality of pulses and said plurality of delayed pulses, and if said first thermometer code output is less than said second thermometer code output, then said counter output decrements said delay selection lines thereby decreasing the delay between said plurality of pulses and said plurality of delayed pulses;

an or-gate, said or-gate receiving said signal input and said delayed output signal, and generating an output; and an edge triggered toggle circuit, said toggle circuit receiving said output of said or-gate and generating an output, so that when said first thermometer code output equals said second thermometer code output, said output of said toggle circuit has a fifty-percent duty cycle.

2. The apparatus of claim 1, further comprising a clock input signal having a plurality of edges, and a one-shot circuit receiving said clock input signal and generating a short duration pulse for each of said plurality of edges of said clock input signal wherein said signal input comprises a plurality of said short duration pulses.

3. The apparatus of claim 1, wherein said programmable delay line includes a plurality of inverters stages each having an output and a propagation delay, and a plurality of tap lines for outputting said delayed output signal, each one of said plurality of said tap lines coupled to one output of said inverter stages, wherein one of said tap lines is selected by adjusting said delay selection lines.

4. The apparatus of claim 3, wherein said propagation delay is approximately 1 ns.

5. The apparatus of claim 3, wherein said programmable delay line includes $2^n$ inverter stages.

6. The apparatus of claim 1, further comprising a finite state-machine for controlling and sequencing the operations of the apparatus.

7. The apparatus of claim 6, wherein said state-machine resets said first thermometer code generator and said second thermometer code generator prior to the outputting of said first and said second thermometer code output, respectively.

8. The apparatus of claim 1, wherein said first thermometer code generator includes a start input and an end input, a plurality of inverters being coupled to said start input, each of said inverters having an output, a plurality of set-reset latches having a set input and an output, said set input of each of said plurality of set-reset latches being coupled to said output of one of said plurality of inverters; a plurality of latches having a data input, a clock input and an output, said output of each of said plurality of set-reset latches being coupled to said data input of one of said plurality of latches, said signal input being coupled to each of said clock inputs of said plurality of said latches, wherein when said delayed output signal is coupled to said start input and said signal input is coupled to said end input, said outputs of said plurality of latches represents said first thermometer code output.

9. The apparatus of claim 8, wherein each of said plurality of inverters has a propagation delay of approximately 1 ns.

10. The apparatus of claim 8, wherein said first thermometer code generator has $2^n$ inverters, $2^n$ set-reset latches and $2^n$ latches.

11. The apparatus of claim 1, wherein said second thermometer code generator includes a start input and an end input, a plurality of inverters being coupled to said start input, each of said inverters having an output, a plurality of set-reset latches having a set input and an output, said set input of each of said plurality of set-reset latches being coupled to said output of one of said plurality of inverters; a plurality of latches having a data input, a clock input and an output, said output of each of said plurality of set-reset latches being coupled to said data input of one of said plurality of latches, said signal input being coupled to each of said clock inputs of said plurality of said latches, wherein when said delayed output signal is coupled to said end input and said signal input is coupled to said start input, said outputs of said plurality of latches represents said second thermometer code output.

12. The apparatus of claim 8, wherein each of said plurality of inverters has a propagation delay of approximately 1 ns.

13. The apparatus of claim 8, wherein said first thermometer code generator has eight inverters, eight set-reset latches and eight latches.

14. An apparatus for providing a clock signal having a fifty-percent duty cycle, comprising:

a signal input having a plurality of pulses;

a delay means for producing a delayed output signal having a plurality of delayed pulses, each of said plurality of delayed pulses being delayed relative to one of said plurality of pulses;

means for measuring a first delay between one of said plurality of delayed pulses and a next of said plurality of pulses;

means for measuring a second delay between one of said plurality of pulses and a corresponding delayed pulse of said plurality of delayed pulses;

means for comparing said first delay to said second delay;

means for increasing the delay of said delay means if said first delay is greater than said second delay and decreasing the delay of said delay means if said first delay is less than said second delay; and means for combining said signal input and said delayed output signal thereby outputting said clock signal having a fifty-percent duty cycle.

15. A method for providing a clock signal having a fifty-percent duty cycle, comprising the steps of:

inputting a signal input having a plurality of pulses;

generating a delayed output signal having a plurality of delayed pulses, each of said plurality of delayed pulses being delayed relative to one of said plurality of pulses;

measuring a first delay between one of said plurality of delayed pulses and a next of said plurality of pulses;

measuring a second delay between one of said plurality of pulses and a corresponding delayed pulse of said plurality of delayed pulses;

comparing said first delay to said second delay;

increasing the delay of said delay means if said first delay is greater than said second delay;

decreasing the delay of said delay means if said first delay is less than said second delay; and combining said signal input and said delayed output signal thereby outputting said clock signal having a fifty-percent duty cycle.

* * * * *